United States Patent
Bruce et al.

(10) Patent No.: US 11,723,293 B2
(45) Date of Patent: Aug. 8, 2023

(54) REACTIVATION OF A DEPOSITED METAL LINER

(71) Applicant: International Business Machines Corporation, Armonk, NY (US)

(72) Inventors: Robert L. Bruce, White Plains, NY (US); Cheng-Wei Cheng, White Plains, NY (US); Matthew Joseph BrightSky, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 17/213,283

(22) Filed: Mar. 26, 2021

(65) Prior Publication Data
US 2022/0310912 A1    Sep. 29, 2022

(51) Int. Cl.
*H01L 45/00* (2006.01)
*H10N 70/00* (2023.01)
*H10N 70/20* (2023.01)

(52) U.S. Cl.
CPC ....... *H10N 70/8413* (2023.02); *H10N 70/011* (2023.02); *H10N 70/231* (2023.02); *H10N 70/826* (2023.02)

(58) Field of Classification Search
CPC .................................................. H01L 45/126
See application file for complete search history.

(56) References Cited

U.S. PATENT DOCUMENTS

| | | | |
|---|---|---|---|
| 6,169,027 B1 | 1/2001 | Dobson | |
| 6,355,558 B1 | 3/2002 | Dixit | |
| 8,227,344 B2 | 7/2012 | Selsley | |
| 9,847,222 B2 | 12/2017 | Reilly | |
| 10,312,142 B2 | 6/2019 | Kirby | |
| 2003/0027427 A1 | 2/2003 | Ma | |
| 2014/0369114 A1* | 12/2014 | Kim | G11C 11/5678 365/163 |
| 2020/0058862 A1* | 2/2020 | Howard | H01L 45/16 |
| 2020/0411755 A1* | 12/2020 | Lin | H01L 45/1253 |
| 2022/0310911 A1* | 9/2022 | Ok | H01L 45/1675 |
| 2022/0344582 A1* | 10/2022 | Lin | H01L 45/124 |

FOREIGN PATENT DOCUMENTS

WO    2017070479 A1    4/2017

* cited by examiner

*Primary Examiner* — Mounir S Amer
(74) *Attorney, Agent, or Firm* — Edward J. Wixted, III

(57) ABSTRACT

Aspects of the present invention provide a semiconductor structure for a phase change memory device that includes a heater element on a bottom electrode that is surrounded by a dielectric material. The phase change memory device includes a metal nitride liner over the heater element, where the metal liner is oxide-free with a desired electrical resistance. The phase change memory device includes a phase change material is over the heater element and the dielectric material and a top electrode is over the phase change material.

16 Claims, 7 Drawing Sheets

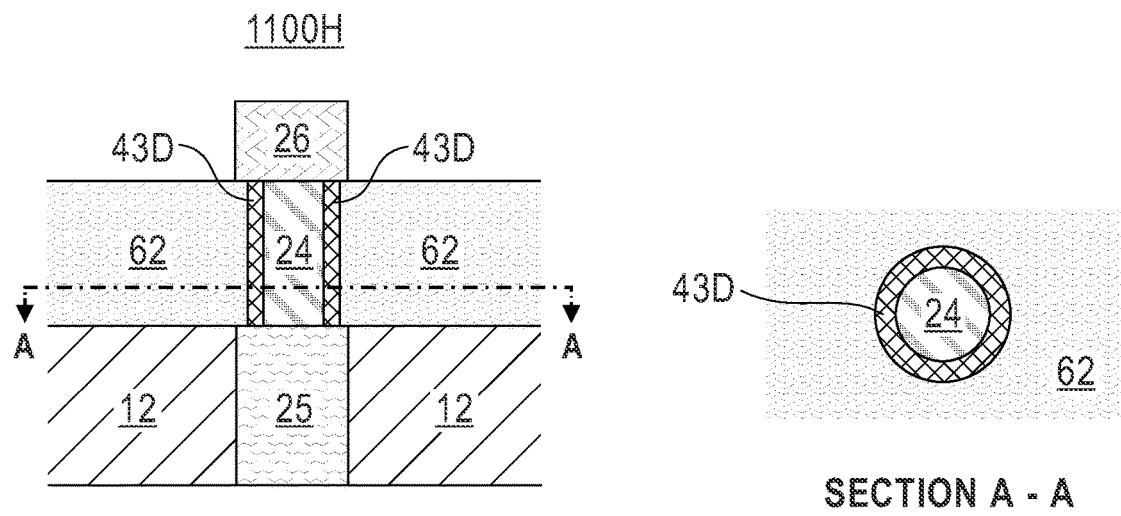
FIG. 11H
SECTION A - A
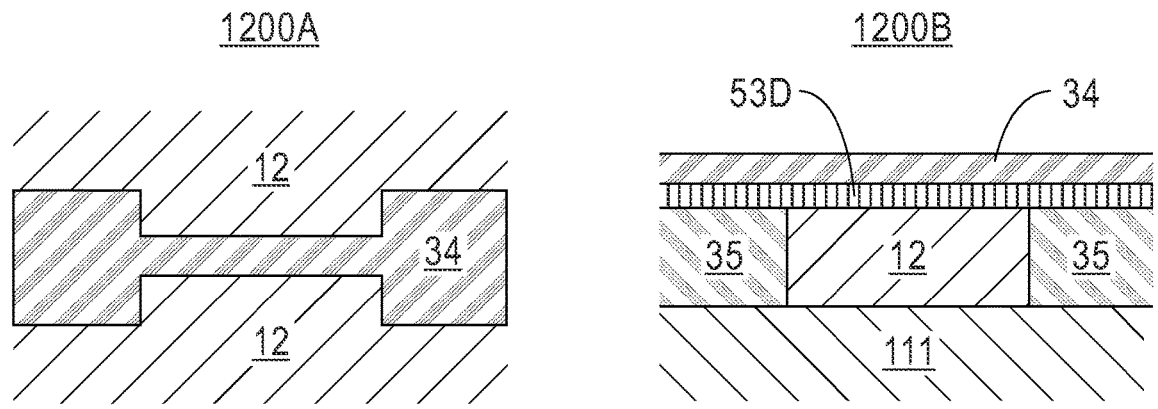
FIG. 12A
FIG. 12B
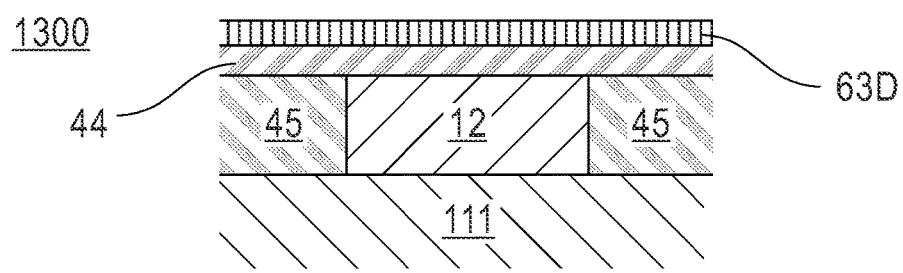
FIG. 13

REACTIVATION OF A DEPOSITED METAL LINER

BACKGROUND OF THE INVENTION

The present invention relates generally to the field of semiconductor device technology and more particularly to forming a metal liner in a phase change memory device.

A metal liner can be incorporated into semiconductor chips for many purposes. The incorporation of a metal liner in phase change memory (PCM) devices as a resistance drift stabilizer is emerging. Typically, in high density, high-performance memory and particularly, in artificial intelligence applications, resistance drift in PCM devices is becoming increasingly important. Typically, resistance drift in the amorphous state of the phase change material in a PCM device occurs due to the structural relaxation in the amorphous state of the phase change material over time at ambient temperatures resulting in a steady increase in the electrical resistance of the amorphous phase change material.

A phase change material in a PCM device typically has at least two solid phases, a crystalline state, and an amorphous state. The transformation between these two phases can be achieved by changing the temperature of the phase change material. Typically, the transformation of the phase change material can be induced by heating through optical pulses or electrical or Joule heating. The optical and electronic properties can vary significantly between the amorphous and crystalline phases of the phase change material. In typical memory applications, switching from the high-resistance or "reset" state, where part or all of the phase change material is amorphous, occurs when a current pulse is applied that heats the amorphous material above the crystallization temperature for a sufficiently long time for the material to crystallize. Switching from the low-resistance or "set" state, where the phase change material is crystalline, is achieved by a high current pulse with a very short trailing edge. In typical PCM semiconductor applications, the current pulse heats the phase change material by Joule heating, melts it, and enables very fast cooling (melt-quenching) such that the phase change material solidifies in the amorphous state.

SUMMARY

Embodiments of the present invention provide a semiconductor structure for a phase change memory device that includes a heater element on a bottom electrode that is surrounded by a dielectric material. The phase change memory device includes a metal nitride liner over the heater element, where the metal liner is oxide-free with a desired electrical resistance. The phase change memory device includes a phase change material is over the heater element and the dielectric material and a top electrode is over the phase change material.

Embodiments of the present invention provide a method of forming a metal nitride liner in a phase change memory device. The method includes depositing a metal nitride liner on a heater element in a dielectric material and on the dielectric material. The method includes performing a sputter clean process to remove surface oxides on the metal nitride liner and performing a nitridation of the metal nitride liner with a nitrogen plasma. Additionally, the method includes depositing a phase change material on the metal nitride liner.

BRIEF DESCRIPTION OF THE DRAWINGS

The aspects, features, and advantages of various embodiments of the present invention will be more apparent from the following description taken in conjunction with the accompanying drawings.

FIG. 11H is a cross-sectional view of the semiconductor structure after forming top electrode 26 in accordance with an embodiment of the present invention.

FIG. 12A is a top view of a semiconductor structure with a reactivated metal liner in a horizontal phase change bridge in a PCM device in accordance with an embodiment of the present invention.

FIG. 12B is a cross-sectional view of the semiconductor structure with the reactivated metal liner in the horizontal phase change bridge in the PCM device in accordance with an embodiment of the present invention.

FIG. 13 is a cross-sectional view of a semiconductor structure of another reactivated metal liner in a horizontal phase change bridge in a PCM device in accordance with an embodiment of the present invention.

DETAILED DESCRIPTION

Figure 1A:
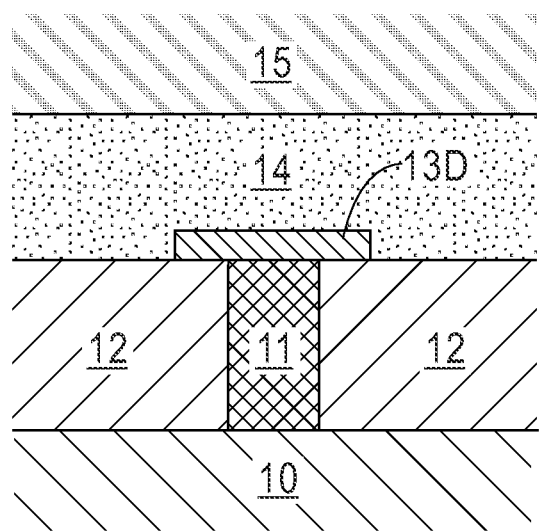
FIG. 1A is a cross-sectional view of a semiconductor structure with a reactivated, personalized metal liner on a pillar of heater material and a portion of an interlevel dielectric (ILD) material covered by a phase change material in accordance with an embodiment of the present invention.

Embodiments of the present invention recognize that metal liners are being incorporated into PCM devices as a resistance drift stabilizer. Embodiments of the present invention recognize that to be effective as a resistance drift stabilizer, the metal liner requires a well-defined thickness and a consistent electrical resistance.

Embodiments of the present invention recognize that the electrical resistance of a metal liner is sensitive to both processing and environmental exposures. The exposure of the surface of the metal liner material to oxygen creates a high resistance oxide layer on the surface of the metal liner. Embodiments of the present invention recognize that current methods of forming a metal liner without a surface oxide layer under the deposited phase change material include using a single vacuum chamber with multiple targets that are capable of performing multiple operations or by using a clustered set of tools that can maintain a vacuum or oxygen-free environment between each of the clustered tools.

Embodiments of the present invention recognize that an ability to perform additional operations, such as personalization of metal liners without creating surface oxides is not a current practice with semiconductor chip manufacturing process flows for PCM devices with metal liners. Current PCM device manufacturing processes for metal liners limit the number and type of post-metal liner deposition processes. Embodiments of the present invention recognize that an ability to provide metal liners without a layer of high resistance surface oxides can improve the performance of a PCM device. Additionally, embodiments of the present invention recognize eliminating the effects of resistance drift in the phase change material would improve the performance of a PCM device.

Embodiments of the present invention provide a metal liner in a PCM device that has an oxide-free surface that has been repaired and modified after surface oxide removal to provide a desired electrical resistance in the metal liner. Embodiments of the present invention include a desired or targeted electrical resistance of the metal liner that is less than the electrical resistance of the phase change material in an amorphous state and greater than the electrical resistance of the phase change material in a crystalline state. Embodiments of the present invention provide an oxide-free surface of the reactivated metal liner where the reactivation of the metal liner includes a sputter clean process and a nitridation process occurring in an oxygen-free environment that repairs damage to the surface of the metal liner occurring during the sputter clean process. Additionally, embodiments of the present invention provide a nitridation process using a nitrogen plasma that adjusts or modifies the electrical resistance of the reactivated metal liner by changing the stoichiometry of the metal liner along with repairing the atomic structure of the metal liner damaged during oxide removal.

Embodiments of the present invention provide a reactivated metal liner without high resistance surface oxides and with a repaired top surface atomic structure that improves PCM device electrical performance. Additionally, the nitridation process provides an ability to adjust the stoichiometry or the ratio of components in the reactivated metal liner to provide a signal path through the reactivated metal liner when the phase change material is in a high resistance amorphous state. Using the metal liner as a signal path when portions of the phase change materials are in an amorphous state improves PCM device function by avoiding possible read errors due to resistance drift occurring in the amorphous portions of the phase change material over time.

Additionally, embodiments of the present invention provide a reactivated metal liner that is modified or tuned for a desired electrical resistance using the nitridation process after a sputter clean process. The use of the nitrogen plasma process for the nitridation of the metal liner after surface oxide removal provides a desired electrical resistance in the metal liner by modifying and repairing the surface of the metal liner after the sputter clean process. The nitridation of the metal liner changes the atomic structure of the surface of the metal liner to reduce the electrical resistance of the metal liner. The nitridation of the metal liner can change the stoichiometry or the ratio of components in a metal nitride liner to further adjust the electrical resistance of the oxide-free metal liner. After the sputter clean process, the electric resistance of the oxide-free metal liner is below the electrical resistance of the crystalline phase change material. After the nitridation process that repairs the metal liner surface and adjusts the ratio of components in the metal liner, the reactivated metal liner has an electrical resistance that is greater than the electrical resistance of the crystalline phase change material and less than the electrical resistance of the amorphous phase change material.

Embodiments of the present invention provide a method to adjust or control the electrical resistance of a reactivated metal liner using a sputter clean process and a nitrogen plasma process occurring in an oxygen-free environment. Controlling the electrical resistance of the reactivated metal liner using the sputter clean and nitridation process parameters provides an electrical signal path in the PCM device that uses the crystalline state of the phase change material and the reactivated metal liner when the phase change material is in an amorphous state. The desired electrical resistance of the reactivated metal liner is preserved after the nitridation process by maintaining the oxygen-free environment for the deposition of the next layer of material, such as a phase change material over the reactivated metal liner.

Embodiments of the present invention provide a number of different PCM device structures with a reactivated metal liner, but the PCM device structures are not limited to these structures. The general processes disclosed in the present invention for creating the reactivated metal liner can be applied by one skilled in the art to form other PCM device structures. Some of the PCM device structures include a conventional mushroom type PCM device structure, a horizontal phase change bridge PCM device structure, a vertical pillar PCM device which also can be called a vertical PCM device structure or a vertical pillar PCM device structure, and a modified conventional mushroom type PCM device where the reactivated metal liner is embedded in a trench or via in the ILD directly above the heater element on the bottom electrode and also, in the trench or via.

Embodiments of the present invention provide a method of forming a personalized, reactivated metal liner with a top surface that is free of oxides and with a repaired and modified atomic structure that provides a desired electrical resistance in the metal liner. The method of forming the personalized metal liner includes depositing the metal liner using known deposition processes and optionally, personalizing the metal liner using known photolithography and selective etch processes in an ambient environment with oxygen. The method includes removing the surface oxides on the personalized metal liner using a sputter clean process, performing a plasma nitridation to repair and reactivate the surface of the metal liner after the sputter clean process, and depositing the phase change material on the reactivated and personalized metal liner while maintaining an oxygen-free environment between and during each of the sputter clean processes, the nitridation, and the phase change material deposition processes. After depositing the phase change material, a top electrode is formed on the phase change material or on a portion of the phase change material. Embodiments of the present invention include other variations of the processes and materials used for creating a reactivated metal liner in a PCM device.

Detailed embodiments of the claimed structures and methods are disclosed herein. The method described below does not form a complete process flow for manufacturing integrated circuits, such as semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures represent cross-section portions of a phase change material in a semiconductor device, such as a memory device. The figures are not drawn to scale but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1A is a cross-sectional view of semiconductor structure 100A with personalized metal liner 13D after reactivation in accordance with an embodiment of the present invention. Personalized metal liner 13D is depicted on heater material 11 and on portions of a layer of interlevel dielectric (ILD 12. As depicted, FIG. 1A includes top electrode 15, phase change (PC) material 14, personalized metal liner 13D after reactivation, heater material 11, ILD 12, and bottom electrode 10. In other embodiments, personalized metal liner 13D covers a smaller portion or a larger portion of ILD 12, or just covers heater material 11. In other examples, personalized metal liner 13D has a different shape. In other examples, multiple personalized metal liners 13D are formed after reactivation.

Bottom electrode 10 may be formed of any conductive material used in semiconductor chip electrodes. The conductive material that provides the bottom electrode 10 may include but is not limited to, copper (Cu), titanium nitride (TiN), tungsten (W), tungsten nitride (WN), tungsten carbide (WC), silver (Ag), gold (Au), aluminum (Al) or the like. In some embodiments, bottom electrode 10 resides on a semiconductor device (not depicted) or on a contact in a semiconductor substrate (not depicted). In some embodiments, bottom electrode 10 connects to a contact (not shown) which extends through an interlevel dielectric (not shown) to access underlying circuitry or transistors in a semiconductor substrate (not shown).

As depicted, heater material 11 forms a pillar on bottom electrode 10 in ILD 12. As depicted, heater material 11 is below a portion of personalized metal liner 13D. Heater material 11 is not limited to the shape, or size depicted in FIG. 1A. In other examples, heater material 11 forms a large rectangle, a cone shape, or may protrude above or below the surface of ILD 12. One or more portions of heater material 11 may contact personalized metal liner 13D. Heater material 11 can be composed of high resistance material or metal used in PCM or other semiconductor applications. Heater material 11 may be titanium nitride (TiN), tantalum nitride (TaN), or other similar resistive metal material.

PC material 14 can be any phase change material used in semiconductor or PCM device applications. As depicted in FIG. 1A, PC material 14 is above personalized metal liner 13D and a portion of ILD 12, and below top electrode 15. PC material 14 may be composed of but not limited to, germanium-antimony-tellurium (GeSbTe also known as GST) or a germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, and combinations thereof. PC material 14 may be undoped or doped (e.g., doped with one or more of O, N, H, Si, or Ti). While depicted as a layer of PC material 14 covering heater material 11 and ILD 12, in other examples PC material 14 is a segment or a portion of a layer on ILD 12. In some examples, PC material 14 may have a rectangular, circular, or another shape above some or all of personalized metal liner 13D.

Personalized metal liner 13D can be composed of any metal liner material. For example, personalized metal liner 13D may be composed of titanium-nitrogen alloys (TixNy), tantalum-nitrogen alloys (TaxNy), carbon-hydrogen alloys (CxHy), titanium-aluminum-nitrogen alloys (TixAlyNz), or tantalum-aluminum-nitrogen alloys (TaxAlyNz) where x, y, and z are integers. Personalized liner 13D is not limited to these materials. Personalized metal liner 13D may be deposited as a very thin metal layer (e.g., 1 to 50 nm) using a thin film deposition process, such as atomic layer deposition.

In various embodiments, personalized metal liner 13D is an oxide-free, reactivated metal liner where the reactivation of personalized metal liner 13D occurs after personalization of the deposited metal liner material. The reactivation of personalized metal liner 13D includes repairing damage to the top surface (e.g., to the atomic structure) of metal liner 13D after oxide removal and adjusting the electrical resistance of metal liner 13D using the nitrogen plasma to both repair damage to the surface of metal liner 13D and to change the stoichiometry or the ratio of components in metal liner 13D to achieve a desired electric resistance in metal liner 13D. A method of forming metal liner 13A is discussed later in more detail with reference to FIG. 8.

Reactivating and repairing metal liner 13D with a nitrogen plasma after sputter cleaning the metal liner material can adjust the electrical resistance of personalized metal liner 13D. After reactivation with the nitrogen plasma, personalized metal liner 13D is without surface oxides and has a repaired atomic structure with the stoichiometry or adjusted ratio of components with an electrical resistance that provides a route from bottom electrode 10 to top electrode 15, for example, for electrical current or signal through metal liner 13D when PC material 14 is in an amorphous state. In this way, personalized metal liner 13D can provide a consistent electrical resistance during read operations of the PCM device rather than executing the read operations using an electrical current that transmits through the amorphous state portions of PC material 14. As previously discussed, resistance drift of phase change materials, particularly in portions of PC material 14 in the amorphous state can cause a decay or reduction in the electrical resistance of PC material 14 and reduce the functionality of the PCM device. For this reason, providing personalized metal liner 13D after reactivation using nitridation after surface oxide removal can improve PCM device function, particularly during read operations.

Figure 1B:
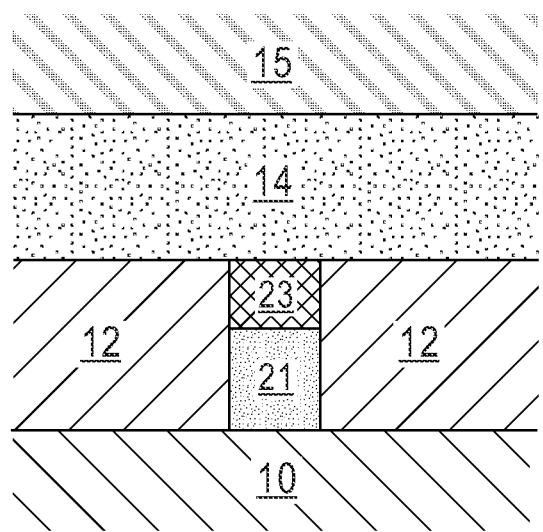
FIG. 1B is a cross-sectional view of a semiconductor structure with a reactivated metal liner embedded in an interlevel dielectric in accordance with another embodiment of the present invention.

FIG. 1B is a cross-sectional view of semiconductor structure 100B with reactivated metal liner 23 covered by PC material 14 in accordance with another embodiment of the present invention. As depicted, FIG. 1B includes PC material 14, bottom electrode 10, a deposited, polished, and reactivated metal liner 23 above heater material 21 in ILD 12. Heater material 21 may be the same or different heater material than used in heater material 11 of FIG. 1A. Reactivated metal liner 23 which is embedded in ILD 12 may be composed of the same metal liner material or a different metal liner material as personalized metal liner 13D of FIG. 1A.

FIG. 1B depicts reactivated metal liner 23 that is embedded in ILD 12 and is planar with the surface of the dielectric material in ILD 12. As depicted, FIG. 1B includes bottom electrode 10 under heater material 21, ILD 12, reactivated metal liner 23 which is embedded in ILD 12, and PC material 14. FIG. 1B depicts one example of an embedded, three-dimensional reactivated metal liner 23 that can be formed by depositing a layer of metal liner material over heater material 21 in a trench or hole in ILD 12.

While depicted as a rectangular trench, in other examples, reactivated metal liner 23 may be formed in a rounded shape trench, a via, an L-shaped trench, a bowl-shaped trench, or another shape. In various embodiments, reactivated metal liner 23 is embedded in a dielectric material, such as ILD 12, and is above or connected to a portion of heater material 21 and a top electrode (not depicted).

Formation of semiconductor structure 100B can occur by forming a trench or via in ILD 12 using known photolithography and selective etch processes and then depositing a layer of heater material 21 in the trench or via in ILD 12 using, for example, atomic layer deposition (ALD), chemical vapor deposition (CVD), plasma vapor deposition (PVD), or plating. After heater material 21 deposition, chemical mechanical polish (CMP) occurs and a selective etch removes a portion of heater material 21 remaining in the via or trench to recessing heater material 21 in the trench. A layer of metal liner material deposits on heater material 21 and ILD 12. A CMP may planarize the surface of semiconductor structure 100B to leave a top portion of metal liner 23 exposed and a portion ILD 12 exposed. While maintaining an oxygen-free environment, the surface oxides on metal liner 23 may be removed using a sputter cleaning process and a nitrogen plasma used to repair damage to the top surface of the metal liner and form reactivated metal liner 23. While still in the oxygen-free environment (e.g., by a vacuum chamber or a clustered set of sputter and plasma tools connected by a vacuum environment), a layer of PC material 14 is deposited on the cleaned and repaired surface of reactivated metal liner 23. As depicted, the top surface of reactivated metal liner 23 is level with a top surface of ILD 12. In other examples, a top surface of heater material 21 may be further up the via or trench or be lower in the via or trench. Additionally, reactivated metal liner 23 and heater material 21 may be narrower or wider than depicted in FIG. 1B. In one embodiment, reactivated metal liner 13D contacting heater material 14 is wider than heater material 21.

Figure 1C:
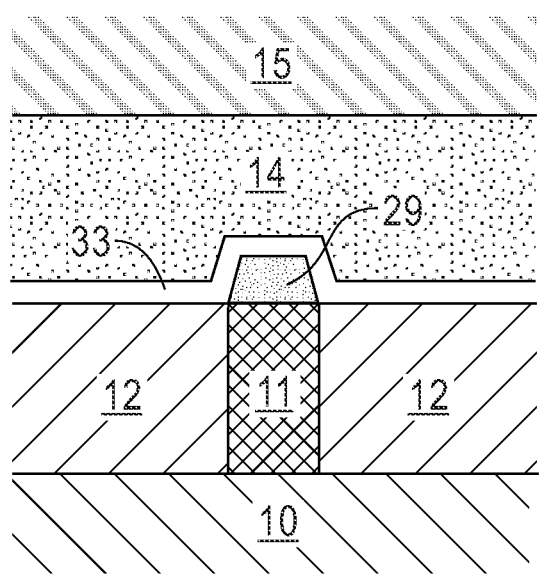
FIG. 1C is a cross-sectional view of a semiconductor structure with a reactivated metal liner on a non-planar surface in accordance with another embodiment of the present invention.

FIG. 1C is a cross-sectional view of semiconductor structure 100C with metal liner 33 after reactivation on a non-planar surface in accordance with another embodiment of the present invention. As depicted, FIG. 1C includes ILD 12, bottom electrode 10, heater material 11, bump 29, metal liner 33, and PC material 14. Bottom electrode 10 may be on a semiconductor substrate (not depicted) or on a contact in a semiconductor substrate (not depicted). As depicted, metal liner 33 is a non-planar or three-dimensional layer of a metal liner material that covers ILD 12 and bump 29. Metal liner 33, as depicted, is not personalized although, in other examples, metal liner 33 can be personalized.

Metal liner 33 may be composed of the same metal liner materials used in personalized metal liner 13D of FIG. 1A. Bump 29 may be composed of a non-conductive material, such as SiO2, an amorphous silicon, or in some embodiments bump 29 is composed of a portion of heater material 11 (e.g., heater material 11 has a shape and a size that protrudes above the top surface of ILD 12). When bump 29 can be deposited and/or formed by a material, such as ILD 12 or with a portion of heater material 11, then metal liner 33, using known deposition methods forms a non-planar layer of the metal liner material over ILD 12 and bump 29.

After deposition of the metal liner material, the semiconductor substrate (not depicted) with bottom electrode 10, ILD 12, bump 29, and metal liner 33 can be placed in an oxygen-free environment, such as a vacuum chamber, and a sputter clean process can remove any surface oxides present on metal liner material. The sputter clean process can be followed by nitridation of the metal liner material using a nitrogen plasma and a deposition of PC material 14 that all occur while maintaining an oxygen-free environment for metal liner 13D (e.g., using a vacuum chamber or a set of clustered tools with vacuum capability). In this way, metal liner 33 with a clean, reactivated non-planar surface that can protrude or extend over bump 29 can provide a desired electrical resistance in metal liner 33.

Figure 2:
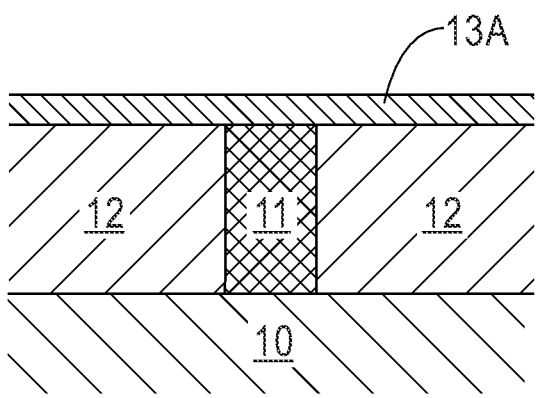
FIG. 2 is a cross-sectional view of a semiconductor structure after depositing a metal liner on a heater material and on a portion of a layer of an ILD in accordance with an embodiment of the present invention.

FIG. 2 is a cross-sectional view of semiconductor structure 200 after depositing metal liner 13A on heater material 11 and ILD 12 in accordance with an embodiment of the present invention. As depicted, FIG. 2 includes as-deposited metal liner 13A, heater material 11, ILD 12, and bottom electrode 10 on a semiconductor substrate (not depicted). Using known semiconductor metal liner deposition processes, such as ALD, metal liner 13A can be deposited over the top surface of semiconductor structure 200. The deposition of metal liner 13A can occur in an oxygen-free environment or in an ambient environment (e.g., oxygenated environment). Metal liner 13A may be composed of, but not limited to, tantalum nitride (TaN), titanium nitride (TiN), tantalum-aluminum-nitride (TiAlN), carbon-hydrogen (CH), another metal liner material, and alloys of these materials. The thickness of the metal liner material may range from 1 nm to 50 nm but is not limited to these thicknesses. Immediately after deposition in a vacuum deposition tool, the top surface of metal liner 13A is oxide-free.

Figure 3:
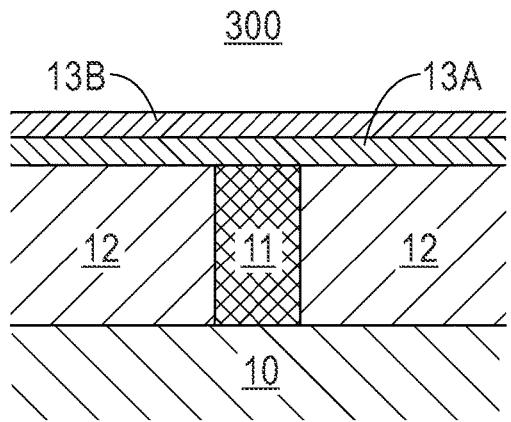
FIG. 3 is a cross-sectional view of the semiconductor structure after removing the semiconductor structure from the metal liner deposition chamber in accordance with an embodiment of the present invention.

FIG. 3 is a cross-sectional view of semiconductor structure 300 after removing semiconductor structure 300 from the deposition chamber in accordance with an embodiment of the present invention. As depicted, FIG. 3 includes the elements of FIG. 2 and oxide layer 13B. The materials typically used in metal liners are prone to oxidation when exposed to an oxygen containing environment. As soon as semiconductor structure 200 is exposed to oxygen (e.g., removed from a tool with a vacuum controlled environment), oxide layer 13B forms on the top surface of as-deposited metal liner 13A.

Figure 4:
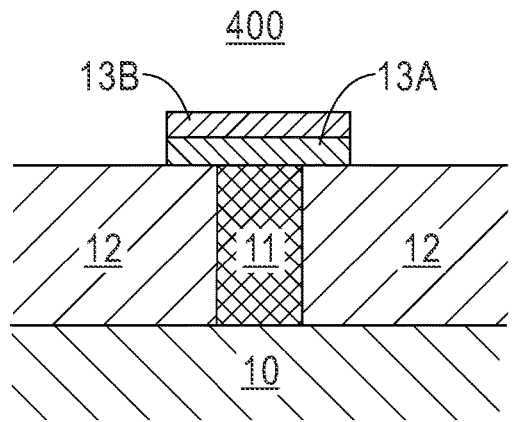
FIG. 4 is a cross-sectional view of the semiconductor structure after personalization of the metal liner in accordance with an embodiment of the present invention.

FIG. 4 is a cross-sectional view of semiconductor structure 400 after the personalization of metal liner 13A with oxide layer 13B in accordance with an embodiment of the present invention. As depicted, FIG. 4 includes the elements of FIG. 3 after the removal of portions of metal liner 13A with oxide layer 13B. Using conventional patterning processes, such as photolithography and a wet or dry etch process, a selective etch of metal liner 13A with oxide layer 13B can occur. In some embodiments, the selective etch of metal liner 13A with oxide layer 13B does not occur (e.g., metal liner 13A with oxide layer 13B remains as a continuous layer over ILD 12 and heater material 11).

FIG. 4 depicts the remaining portion of metal liner 13A with oxide layer 13B. As depicted, the remaining portion of 13A is approximately double the area of the top surface of heater material 11 contacting metal liner 13A. In other examples, more or less of metal liner 13A can remain after selectively etching metal liner 13A with oxide layer 13B. In other examples, more than one portion of metal liner 13A may be present and metal liner 13A with oxide layer 13B can be patterned and selectively etched in any shape.

Figure 5:
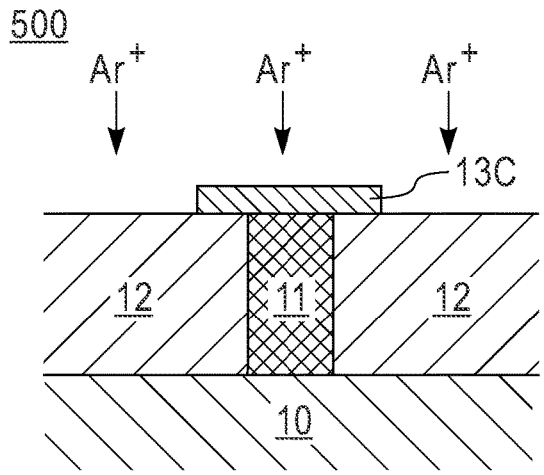
FIG. 5 is a cross-sectional view of the semiconductor structure after performing a sputter operation in an oxygen-free environment to remove an oxidation layer from the top surface of the personalized metal liner in accordance with an embodiment of the present invention.

FIG. 5 is a cross-sectional view of semiconductor structure 500 after performing a sputter clean process to remove oxide layer 13B on metal liner 13A from FIG. 4 in accordance with an embodiment of the present invention. As depicted, FIG. 5 includes heater material 11, ILD 12, and metal liner 13C which is personalized and has an oxide-free top surface after the sputter cleaning process. In various embodiments, semiconductor structure 400 is placed in an oxygen-free sputter clean chamber or tool. After the sputter clean process, such as an argon (e.g., Ar+ plasma) sputter clean, oxide layer 13B from FIG. 4 can be removed from the surface of metal liner 13C. The sputter clean process, however, modifies the structure of the top surface of the metal liner material when forming metal liner 13C. For example, the sputtering process can deplete one element, like removing nitrogen. The depletion of nitrogen in metal liner 13C changes the stoichiometry or the ratio of the components or elements of metal liner 13C (e.g., less nitrogen in a TiN alloy).

The modifications of metal liner 13C during sputter cleaning processes affects the electrical resistance of metal liner 13C. An example of some effects of the sputter clean process on the electrical sheet resistance of a metal liner is depicted later in FIG. 9. Changing the electrical resistance of metal liner 13C due to oxide removal in the argon sputter clean process can be undesirable to the functionality of the PCM device. After sputter cleaning, oxide-free metal liner 13C can have a lower electrical resistance than the electrical resistance of PC material 14 in the crystalline state. Therefore, the electrical current or signals will travel through metal liner 13C with a lower resistance rather than traveling through the crystalline PC material 14 (e.g., prevents reading of PC material 14 in the SET state of the PCM device). After the sputter clean process, semiconductor structure 500 remains in an oxygen-free environment.

Figure 6:
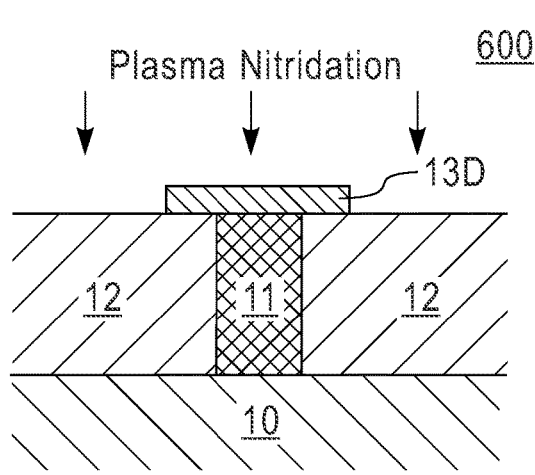
FIG. 6 is a cross-sectional view of the semiconductor structure after performing a nitridation process on the personalized metal liner in the oxygen-free environment in accordance with an embodiment of the present invention.

FIG. 6 is a cross-sectional view of semiconductor structure 600 after performing a nitridation process in accordance with an embodiment of the present invention. As depicted, FIG. 6 includes personalized metal liner 13D, heater material 11, bottom electrode 10, and ILD 12. After performing the sputter clean process discussed above with respect to FIG. 5, semiconductor structure 600 remains in the oxygen-free environment before and after nitridation. For example, nitridation using a nitrogen plasma may occur in the same tool or vacuum chamber or may be performed in the set of clustered tools (e.g., two or more vacuum chambers or tools connected by an oxygen-free or vacuum tube or conveyor system).

The nitridation of semiconductor structure 600 can repair and/or reactivate the surface of metal liner 13C that was damaged by the sputter cleaning process as discussed with respect to FIG. 5. Using a nitrogen plasma for the nitridation of personalized metal liner 13D can provide desired electrical properties, such as a desired electrical resistance in personalized metal liner 13D. In some cases, the nitridation process can adjust the ratio of components or elements in personalized metal liner 13D (i.e., changes the stoichiometry of metal liner 13C). For example, while the sputtering process discussed with respect to FIG. 5 depletes the nitrogen in a metal liner material, the nitridation process using the nitrogen plasma recovers the nitrogen in the metal liner material. For example, using the nitridation process to reactivate personalized metal liner 13D, the ratio of components, such as Ti and N can be adjusted to provide desired electrical properties or a desired electrical resistance in personalized metal liner 13D.

Modifications or changes to the nitrogen plasma process parameters, such as changes in the dwell time in the nitrogen plasma, can alter the properties of the metal liner material and the electrical resistance of personalized metal liner 13D. An example of the effect of the nitridation process on a metal liner after a sputter clean process on the metal liner sheet resistance is depicted later in FIG. 9.

Figure 7:
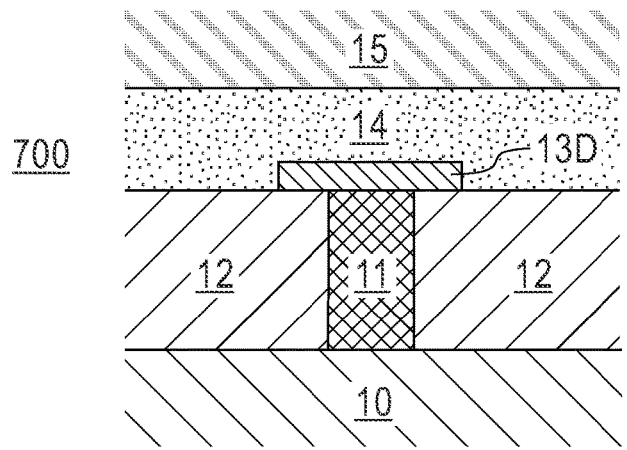
FIG. 7 is a cross-sectional view of the semiconductor structure after depositing a phase change material in the oxygen-free environment in accordance with an embodiment of the present invention.

FIG. 7 is a cross-sectional view of semiconductor structure 700 after depositing PC material 14 and top electrode 15 in accordance with an embodiment of the present invention. As depicted, FIG. 7 includes top electrode 15, personalized metal liner 13D over heater material 11, and portions of ILD 12 with PC material 14 covering personalized metal liner 13D and the exposed portion of ILD 12.

While remaining in the oxygen-free environment and after completing the nitrogen plasma process, a layer of PC material 14 can be deposited over the exposed clean, surfaces of personalized metal liner 13D and ILD 12 using known deposition processes (PVD, CVD, etc.). While depicted as a continuous layer of PC material 14 in FIG. 7, in some embodiments the layer of PC material 14 is personalized or includes other layers of material or other layers of PC material 14 above personalized metal liner 13D and/or ILD 12. For example, PC material 14 may only cover metal liner 13D. The thickness of PC material 14 can vary according to the PCM application, the phase change material used, or the required electrical performance of the semiconductor chip or PCM device.

After PC material 14 is deposited over the exposed surface of personalized metal liner 13D, metal liner 13D is protected from surface oxide formation by the layer of PC material 14 covering personalized metal liner 13D. Once PC material 14 is deposited, semiconductor structure 700 can be moved into an oxygen containing environment. In an ambient environment (i.e., with oxygen), a layer of electrode material can be deposited over PC material 14 using known electrode formation processes (e.g., PVD deposition, photolithography, and selective etch). In various embodiments, personalized metal liner 13D with the desired electrical resistance resides over heater material 11 and a portion of ILD 12 and is directly under PC material 14 that is under top electrode 15 in a PCM device.

Figure 8:
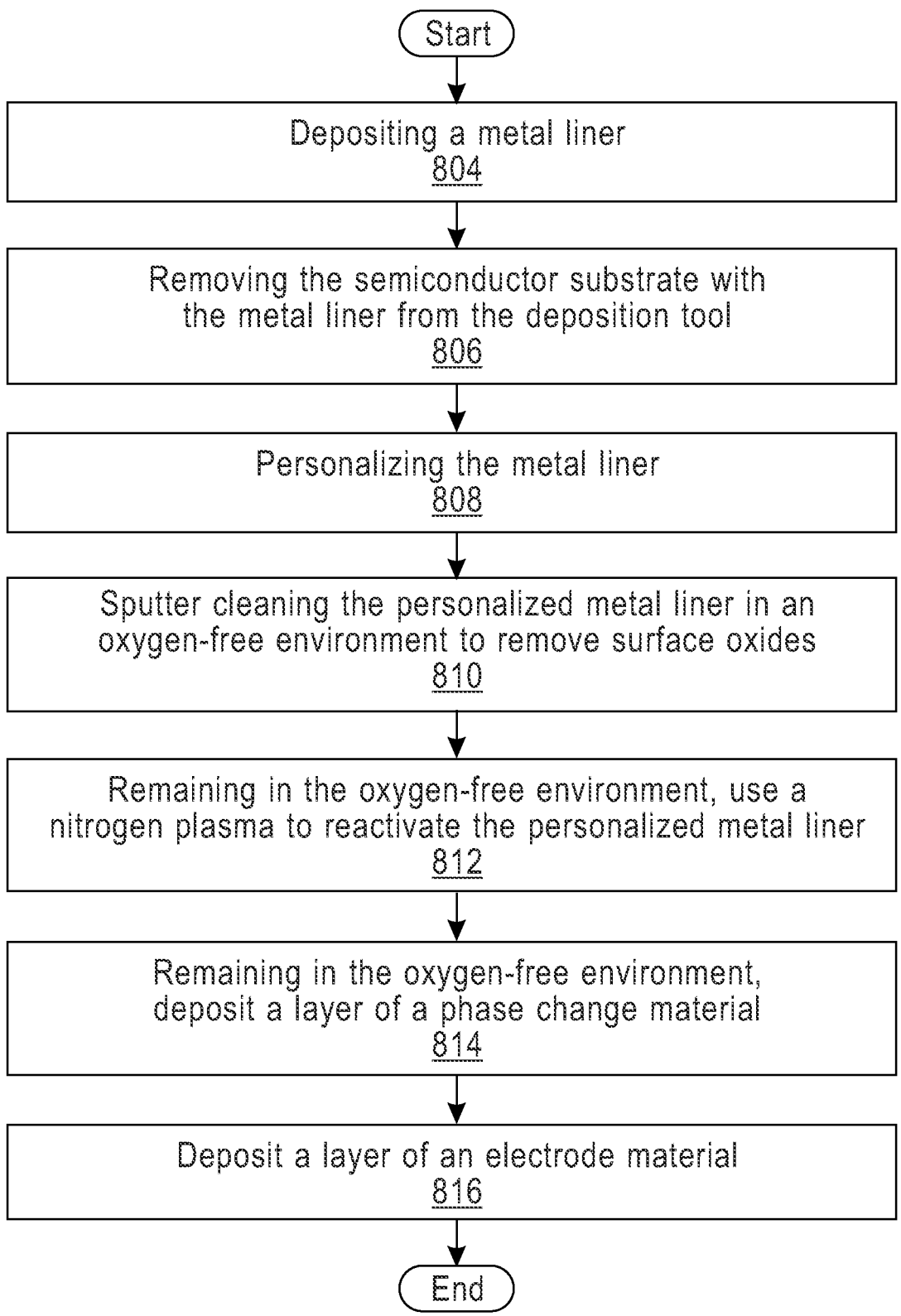
FIG. 8 is a block diagram depicting the operational steps to form a personalized metal liner in a PCM device in accordance with an embodiment of the present invention.

FIG. 8 is a block diagram depicting the operational steps of a method to form a personalized metal liner in a PCM device in accordance with an embodiment of the present invention. The steps of FIG. 8 reflect the processes discussed above to form personalized metal liner 13D depicted in FIGS. 1A and 7.

In step 804, the method includes depositing a metal liner on the top surface of a heater element in a dielectric material. For example, using a known deposition process, such as ALD, PVD, CVD, or plasma-enhanced CVD, a layer of metal material for a metal liner can be deposited. The deposition process may occur in an oxygen-free or vacuum environment or an ambient environment. The thickness of metal liner 13D can range from 1 nm to 50 nm but, is not limited to these thicknesses. In various embodiments, the metal liner material is a metal nitride material. The metal liner may be composed of, but not limited to, titanium-nitrogen alloys (Ti$_x$N$_y$), tantalum-nitrogen alloys (Ta$_x$N$_y$), carbon-hydrogen alloys (C$_x$H$_y$), titanium-aluminum-nitrogen alloys (Ti$_x$Al$_y$N$_z$), or tantalum-aluminum-nitrogen alloys (Ta$_x$Al$_y$N$_z$) where x, y, and z are integers. In various embodiments, the heater element connects to a bottom electrode that is above a semiconductor substrate which may include one or more semiconductor devices.

In step 806, the method includes removing the deposited metal liner from the deposition tool. For example, the semiconductor substrate with the metal liner may be removed from the oxygen-free deposition environment which can cause the formation of a layer of oxides on the exposed surface of the deposited metal liner. In some cases, the metal liner deposition occurs in an oxygen containing environment, and surface oxides form almost immediately on the metal liner after deposition.

In step 808, the method includes personalizing the metal liner. While in an ambient or oxygen environment, the top surface of the deposited metal liner is patterned, for example using photolithography processes, and selectively etched using a dry or a wet etch process to remove portions of the metal liner above ILD 12. The number of portions of the metal liner removed, the size of the removed portions of the metal liner, and the shape of the portions of the metal liner removed can vary. For example, the portion of the metal liner removed may leave one or more rectangular, round, oval, or L-shaped portions of the metal liner remaining on the top surface of the heater element and/or on portions of the surface of the dielectric material. After the selective etch process, the personalized metal liner includes an oxide layer over the top surface of the metal liner. Step 808 is an optional step, in some embodiments, personalization of the metal liner does not occur.

In step 810, the method includes sputter cleaning the metal liner in an oxygen-free environment to remove the surface oxides. For example, the semiconductor substrate with the metal liner may be placed in an oxygen-free environment, such as a vacuum chamber capable of providing a sputter clean process to remove surface oxides formed on the metal liner. For example, an argon plasma may be used in a vacuum chamber to sputter clean the top surface of the personalized metal liner. After removing the surface oxides on the metal liner with the sputter cleaning process, the top surface of the metal liner can be clean and oxide-free. The sputter clean process, however, changes or damages the atomic structure of the personalized metal liner (e.g., significantly reducing the electrical resistance of the metal liner). After completing the sputter cleaning process, the metal liner remains in an oxygen-free environment to prevent the formation of surface oxides on the metal liner.

In step 812, the method includes the semiconductor substrate with the metal liner remaining in the oxygen-free environment and using a nitrogen plasma to reactivate the metal liner. For example, in the same vacuum chamber or another vacuum-connected plasma chamber or tool, the nitridation of the metal liner occurs using a nitrogen plasma.

As previously discussed, the nitridation of the metal liner repairs or reactivates the top surface of the metal liner damaged by the sputter clean process and adjusts the electrical resistance of the metal liner to provide a desired electrical resistance. The nitridation of the metal liner using the nitrogen plasma repairs changes in the atomic structure of the metal liner material that can occur during the sputter clean process. Additionally, the nitridation of the metal liner can adjust the electric resistance of the metal liner, for example, by creating a different or desired ratio of the metal liner elements or components, such as Ti and N. For example, the nitridation of the metal liner can increase the electrical resistance of the metal liner after sputter cleaning by repairing damage to the surface of the metal liner. Additionally, the nitrogen plasma can be used to control or adjust the electrical resistance of the metal liner with structural and stoichiometry modifications. Adjustments to the nitrogen plasma process, such as the metal liner dwell time in the nitrogen plasma, can change the electrical resistance of the metal liner (e.g., increase or decrease changes in the electrical resistance of the metal liner after nitridation). Using the nitrogen plasma, the electrical resistance of the metal liner can be adjusted to match a desired electrical resistance to improve the PCM device functionality. After performing the nitridation of the metal liner, the metal liner remains in the oxygen-free environment to prevent the formation of a new oxide layer on the top surface of the metal liner material.

In step 814, the method includes the metal liner remaining in the oxygen-free environment and depositing a layer of the phase change material. While in the oxygen-free environment, using known semiconductor deposition processes, such as but not limited to PVD or CVD, a layer of a phase change material can be deposited over exposed oxide-free surfaces of the reactivated metal liner and on the exposed surface of the dielectric material (e.g., an ILD material). The layer of the phase change material, such as a doped GST, can be deposited on the exposed surfaces of the surrounding dielectric material and on the clean and reactivated surface of the metal liner while maintaining the oxygen-free environment. Once the layer of the phase change material is deposited on the metal liner, the personalized metal liner is protected from forming surface oxides when exposed to an ambient environment (e.g., with oxygen). After phase change material deposition, the metal liner may be exposed to oxygen.

In step 816, the method includes depositing a layer of an electrode material on the top surface of the phase change material. Using known deposition processes (e.g., PVD, CVD, plating, etc.), deposition of the layer of the electrode material on the phase change material and forming the top electrode in the PCM device can occur in an oxygen containing environment. In various embodiments, the top electrode is on the phase change material. In some embodiments, the top electrode is above a portion of the ILD and a via lined with the metal liner material and filled with the phase change material.

The method steps of FIG. 8 describe a method to form one example of a personalized metal liner. As known to one skilled in the art, the method may be modified to provide a non-personalized metal liner that is surface oxide-free and reactivated with a repaired top surface using a nitrogen plasma. Similarly, the method may be performed with modification on other semiconductor structures, such as depicted as a three-dimensional personalized metal liner that is planar with the surface of the dielectric and imbedded in the dielectric material (e.g., as depicted in FIG. 1B) or on a metal liner that is non-planar and three-dimensional that extends above the dielectric surface (e.g., depicted in FIG. 1C and FIG. 11H)

Figure 9:
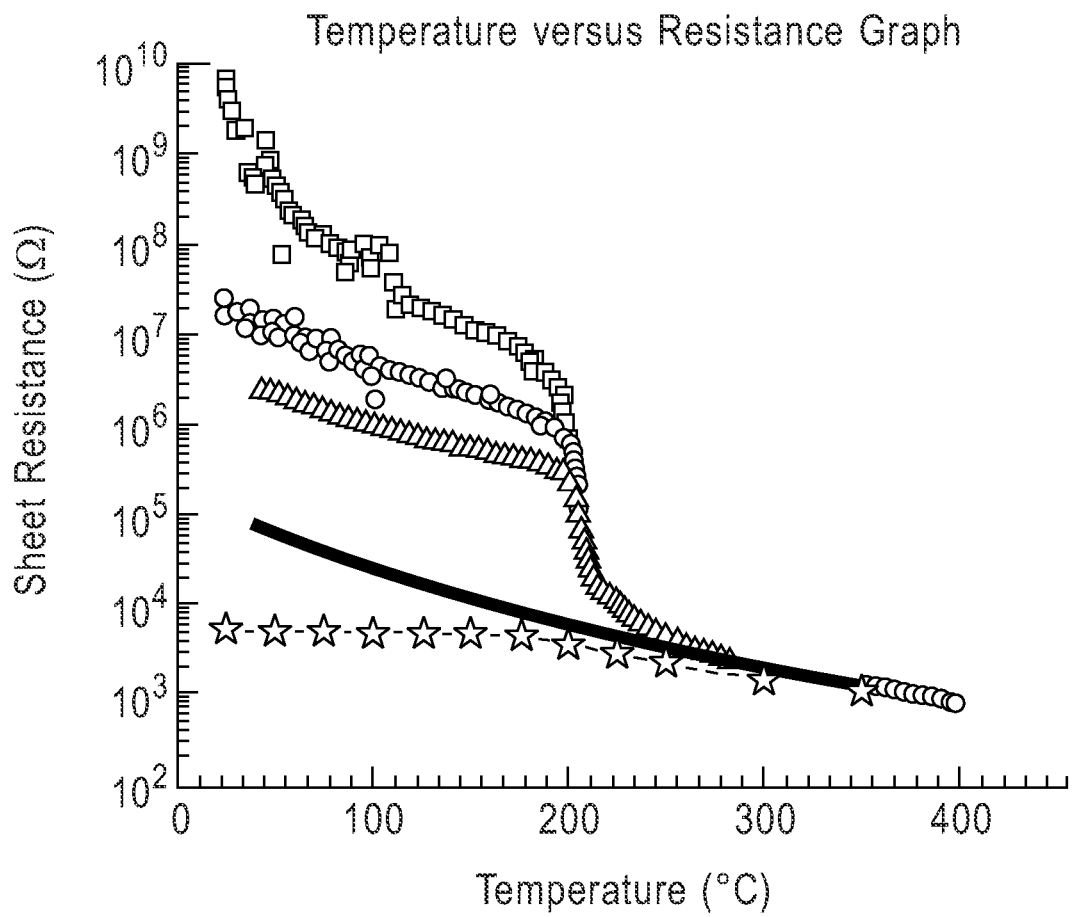
FIG. 9 is a graph of sheet resistance versus temperature for some of the materials in a semiconductor structure composed of a doped germanium-antimony-tellurium (dGST) material and a metal nitride liner after several different processes in accordance with an embodiment of the present invention.

FIG. 9 is a graph of sheet resistance versus temperature for a semiconductor structure with a metal nitride liner and a doped germanium-antimony-tellurium (dGST) material after several different processes in accordance with an embodiment of the present invention. The metal liner is on a layer of SiN (e.g., a high resistance material for heating the dGST). The sheet resistance in ohms ($\Omega$) of the semiconductor structure composed of an ALD deposited metal nitride liner on the layer of SiN that is covered by a layer of a doped GST material is measured with a four-point probe contacting the metal nitride layer or the dGST when the sheet resistance of the dGST is measured. Each line in the sheet resistance versus temperature graphs represents a different method of processing the semiconductor structure.

The sheet resistance was measured at various temperatures for the different methods of forming the semiconductor structure. As depicted in the key on FIG. 9, the line of square data points depicts the sheet resistance of the amorphous dGST on the SiN during heating, the line circular data points depicts the sheet resistance of the deposited metal nitride liner without sputter clean above the layer of SiN (e.g., with surface oxide layer on the metal nitride liner) during heating with an amorphous dGST, the line of triangular data points depicts the sheet resistance of the sputter cleaned metal nitride liner after nitridation using a nitrogen plasma and an amorphous dGST, the black line depicts the sheet resistance of the crystalline dGST in the semiconductor structure during heating and cooling, and the line of star data points depict the sheet resistance of the metal nitride liner with sputter cleaning (no nitrogen plasma) on SiN in the semiconductor structure during heating and cooling when the dGST is in the crystalline phase. For reference, the transition temperature of the dGST is approximately 220 degrees Celsius.

The sputter clean process occurs using argon. The nitrogen plasma repairs damage to the metal nitride liner occurring during the sputter clean process (e.g., the sputter process removes the high resistance surface oxide layer on the metal nitride layer). As previously discussed, the deposition of the dGST, the sputter cleaning process, and the nitrogen plasma occur in-situ with an oxygen-free environment. In other words, the semiconductor substrate remains under vacuum in an oxygen-free environment or chamber(s) for all of these operations and between each of these operations.

As previously discussed, in the PCM device, the electrical signals follow the lowest resistance path. The sheet resistance of the metal nitride liner with surface oxides (e.g., the surface before sputter clean) is approximately 107 ohms and the sheet resistance of the amorphous phase of dGST is approximately 109 ohms. The sheet resistance of the crystalline phase of dGST is approximately 105 ohms and the sheet resistance of the metal nitride liner after sputter clean (only) is approximately 104 ohms. After sputter cleaning processes, the electrical signal would travel through the metal nitride liner that provides a lower resistance path and will not read changes in the dGST.

Ideally, to avoid read errors due to resistance drift in the amorphous phase portions of the phase change material (dGST) and to avoid errors in reading data or signals due to resistance drift in the amorphous phase of the dGST, it would be preferred for the electrical signals to travel along the metal nitride layer when portions of dGST are in an amorphous state.

However, in order to send electrical signals through the dGST when the dGST is in the crystalline state, the resistance of the metal liner cannot be below the resistance of the crystalline dGST which is approximately 105 ohms at room temperatures (e.g., as illustrated by the black line in FIG. 9). After reactivating or repairing the surface of the sputter cleaned metal nitride liner with a short nitridation process using the nitrogen plasma, the sheet resistance of the metal liner depicted as the line of triangular data points is approximately 107 ohms at room temperature and is, therefore, higher than the resistance of the crystalline dGST at room temperature. Therefore, providing a metal nitride layer with oxides removed after reactivation or repair of the metal nitride liner using a nitrogen plasma process and then, depositing dGST while maintaining an oxygen-free environment improves the read performance for a PCM device with a metal liner (e.g., electrical signals pass through the metal nitride liner when the dGST is the amorphous state and pass through portions of the dGST when the dGST is in the crystalline phase).

Figure 10:
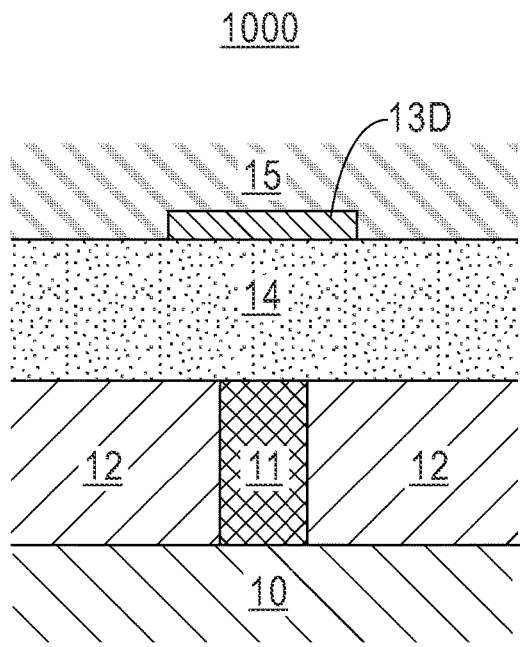
FIG. 10 is a cross-sectional view of a semiconductor structure with a reactivated, personalized metal liner on a layer of the phase change material in accordance with an embodiment of the present invention.

FIG. 10 is a cross-sectional view of semiconductor structure 1000 with metal liner 13D formed over PC material 14 and under top electrode 15 in accordance with an embodiment of the present invention. As depicted, FIG. 10 includes bottom electrode 10, ILD 12 surrounding heater material 11, PC material 14 on heater material 11 and ILD 12, metal liner 13D over and abutting a portion of PC material 14, and top electrode 15 extending over metal liner 13D and exposed portions of PC material 14.

As known to one skilled in the art, semiconductor structure 1000 can be formed with essentially the same processes as discussed in detail with respect to FIG. 8, except that PC material 14 can be deposited over ILD 12 and heater material 11 and covered by metal liner 13D which, in some embodiments, is patterned and selectively etched. After selectively etching the layer of the metal liner material, the sputter clean process, previously discussed, removes surface oxides and a nitridation of metal liner 13D occurs while maintaining an oxygen-free environment. Still maintaining the oxygen-free environment, a deposition of top electrode 15 can occur to form the PCM device depicted in FIG. 10.

Figure 11A:
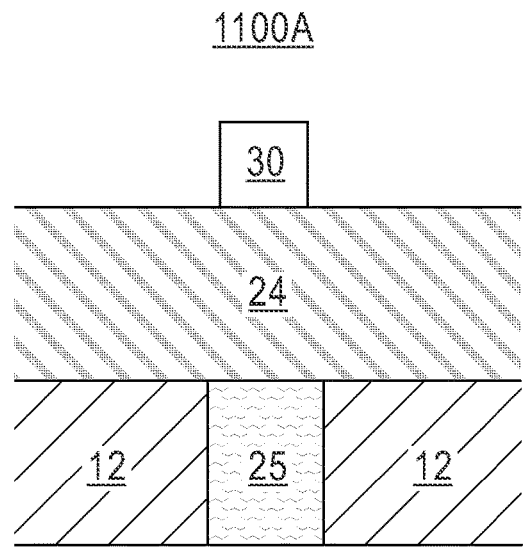
FIG. 11A is a cross-sectional view of a semiconductor structure after patterning a layer of a phase change material above a bottom electrode in accordance with an embodiment of the present invention.

FIG. 11A is a cross-sectional view of semiconductor structure 1100A after patterning a layer of PC material 24 above bottom electrode 25 in accordance with an embodiment of the present invention. As depicted, FIG. 11A includes resist 30, bottom electrode 25 surrounded by ILD 12, PC material 24 over bottom electrode 25 and ILD 12. Bottom electrode 25 can reside on a semiconductor substrate (not depicted) or a contact in the semiconductor substrate and provides a similar or the same function as bottom electrode 10 in FIG. 1A. PC material 24 can be the same or a different phase change material than PC material 10 in FIG. 1A. The top surface of PC material 24 can be patterned using known resist apply and photolithography processes resulting in a portion of resist 30 on the top surface of PC material 24.

Figure 11B:
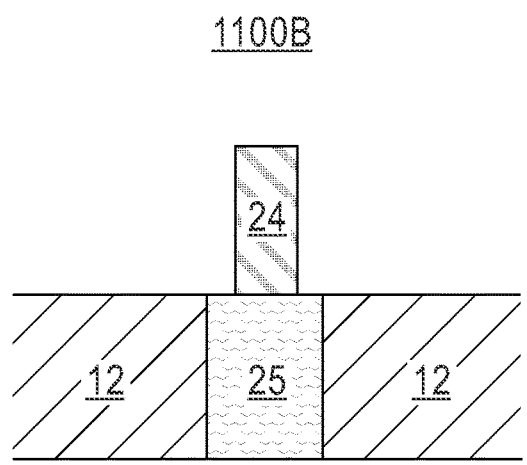
FIG. 11B is a cross-sectional view of the semiconductor structure after selectively etching a portion of the phase change material in accordance with an embodiment of the present invention.

FIG. 11B is a cross-sectional view of semiconductor structure 1100B after selectively etching PC material 24 in accordance with an embodiment of the present invention. Using known etch processes, such as RIE or a wet etch process, the exposed portions of PC material 24 can be removed. After completing the selective etch process, a pillar of PC material 24 remains. The pillar of PC material 24 may have a diameter or a width ranging from 10 to 100 nanometers (nm) but, is not limited to these diameters.

Figure 11C:
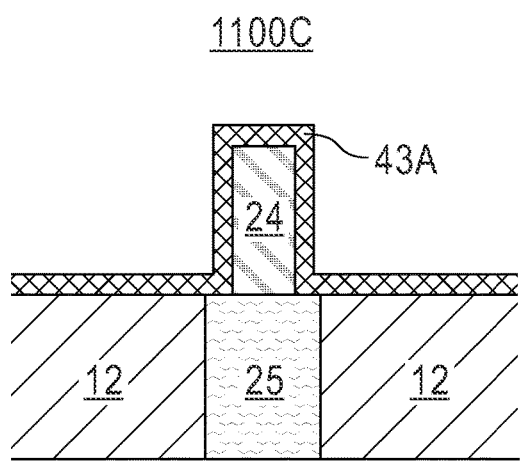
FIG. 11C is a cross-sectional view of the semiconductor structure after depositing a layer of metal liner material in accordance with an embodiment of the present invention.

FIG. 11C is a cross-sectional view of semiconductor structure 1100C after depositing metal liner 43A in accordance with an embodiment of the present invention. As depicted, metal liner 43A can be deposited on exposed portions of bottom electrode 25, on ILD 12, and over PC material 24. Metal liner 43A can be deposited and formed with metal liner materials and processes similar to or the same discussed with respect to metal liner 13A in FIG. 2.

Figure 11D:
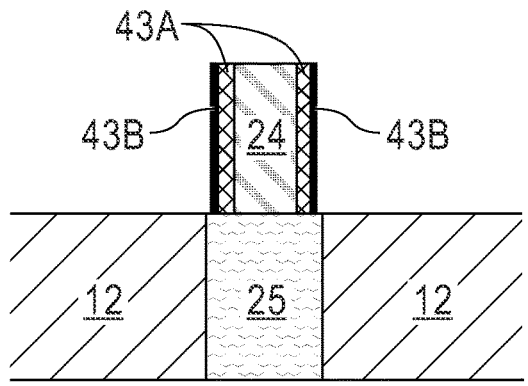
FIG. 11D is a cross-sectional view of the semiconductor structure after selectively removing horizontal portions of the metal liner in accordance with an embodiment of the present invention.

FIG. 11D is a cross-sectional view of semiconductor structure 1100D after selectively removing horizontal portions of metal liner 43A with surface oxides 43B in accordance with an embodiment of the present invention. As soon as metal liner 43A is deposited and exposed to oxygen, surface oxides 43B can form on metal liner 43A. Using known patterning and selective etch processes, such as photolithography and RIE, horizontal portions of metal liner 43A with surface oxides 43B can be removed.

Figure 11E:
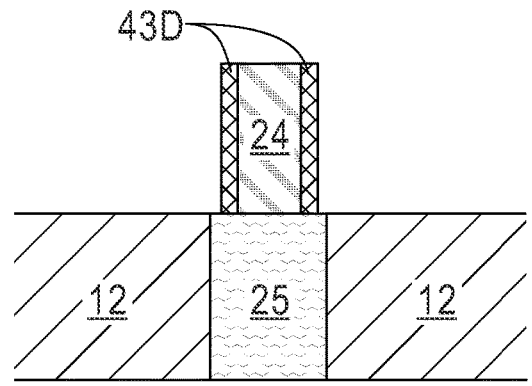
FIG. 11E is a cross-sectional view of the semiconductor structure after surface oxide removal and reactivation of the metal liner in accordance with an embodiment of the present invention.

FIG. 11E is a cross-sectional view of semiconductor structure 1100E after surface oxide removal and reactivation of the metal liner in accordance with an embodiment of the present invention. FIG. 11E depicts metal liner 13D after placing semiconductor structure 1100E in an oxygen-free environment and removing surface oxides 43B using the sputter clean process and adjusting the electrical resistivity of metal liner 13D by the nitridation process as previously discussed in detail with respect to FIG. 8. For example, a sputter clean process with an argon plasma can remove surface oxides 43B. While maintaining the oxygen-free environment, the nitridation process discussed with respect to FIG. 8, reactivates the metal liner material to form metal liner 43D. The nitrogen plasma can repair damage to the surface of the metal liner material occurring during the sputter clean process and the nitrogen plasma can be used to adjust the stoichiometry and electrical resistance of metal liner 43D. After the nitridation process, metal liner 13D with a desired electrical resistance remains in an oxygen-free environment.

Figure 11F:
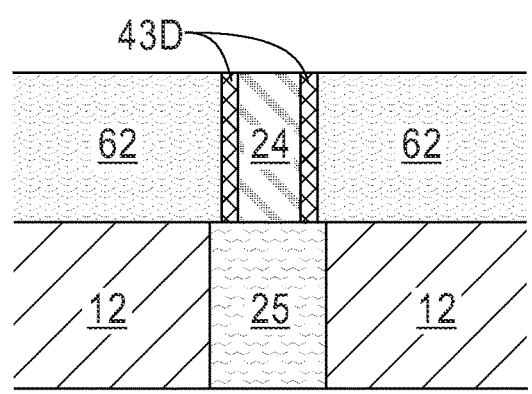
FIG. 11F is a cross-sectional view of the semiconductor structure after depositing another layer of an interlevel dielectric material in accordance with an embodiment of the present invention.

FIG. 11F is a cross-sectional view of semiconductor structure 1100F after depositing ILD 62 in accordance with an embodiment of the present invention. As depicted, FIG. 11F includes the elements of FIG. 11E and ILD 62. ILD 62 is deposited over semiconductor structure 1100F in an oxygen-free environment. Once metal liner 13D is covered and protected by ILD 62, semiconductor structure 1100F can be exposed to oxygen.

Figure 11G:
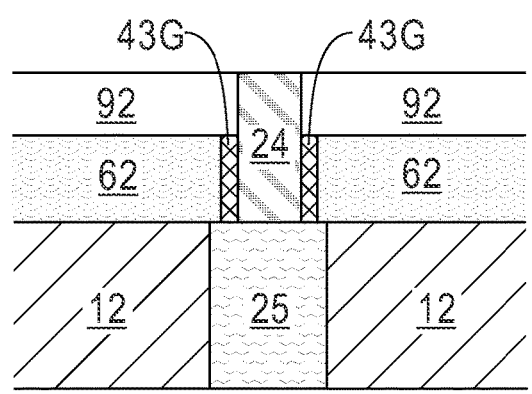
FIG. 11G is a cross-sectional view of the semiconductor structure after selectively removing a top portion of the interlevel dielectric and exposed top portion of the metal liner in accordance with an embodiment of the present invention.

FIG. 11G is a cross-sectional view of semiconductor structure 1100G after selectively removing a top portion of the interlevel dielectric and exposed top portion of the metal liner in accordance with an embodiment of the present invention. FIG. 11G depicts an optional step in forming a vertical pillar PCM device. In this optional step, a top portion of ILD 62 and metal liner 43D are selectively removed and ILD 92 can be deposited around the exposed portions of the pillar of PC material 24. The remaining portion of the metal liner material on the pillar of PC material 24 forms metal liner 43G. As depicted, FIG. 11G includes bottom electrode 25, metal liner 43G, PC material 24, ILD 12, and ILD 92. In some embodiments, metal liner 43G abuts or extends partially up the vertical sides of the pillar of PC material 24. For example, metal liner 43G covers the bottom half of the vertical surface of the pillar of PC material 24. ILD 92 can be deposited over exposed portions of ILD 62, metal liner 43G, and PC material 24. A CMP may be performed.

FIG. 11H is a cross-sectional view of semiconductor structure 1100H after forming top electrode 26 in accordance with an embodiment of the present invention. FIG. 11H can be formed from semiconductor structure 11F depicted in FIG. 11F. As depicted, FIG. 11H includes bottom electrode 25, ILD 12, ILD 62, metal liner 43D, PC material 24, section A-A, and top electrode 26 that is over PC material 24 and metal liner 43D and over portions of ILD 62. A CMP of ILD 62 may occur before top electrode 26 is formed. Top electrode 26 can be formed using known electrode material deposition, patterning, and selective etching processes. Top electrode 26 may be formed in an oxygen containing environment. Section A-A depicts an example of a cross-section of the pillar of PC material 24 that is surrounded by metal liner 43D in ILD 62. In other examples, the pillar of PC material 24 can be larger, smaller, or have a different shape (e.g., oval or rectangular). Typically, the thickness of metal liner 43D can be between 1 nm to 50 nm but, is not limited to these thicknesses. In one embodiment, top electrode 26 is formed on PC material 24 and a portion of ILD 92 after metal liner 43D is recessed (e.g., depicted in FIG. 11F). In various embodiments, a layer of dielectric material deposits over semiconductor structure 1100H surrounding top electrode 26. FIG. 11H depicts one example of a vertical pillar PCM device or a vertical PCM device with metal liner 13D.

In other examples, semiconductor structure 1100H of the vertical PCM device can be formed with another set of processes. In this example, semiconductor structure 1100H can be formed forming a via in layer of ILD 12 deposited over bottom electrode 25. The via contacting a top surface of bottom electrode 26. Using known deposition methods, such as ALD or CVD, a layer of metal liner material can be deposited in the via and on bottom electrode 25 and on the surface of ILD 12. The metal liner material may be removed from horizontal surfaces of ILD 12 and bottom electrode 25 leaving a portion of metal liner material inside the via, for example with an RIE. Using the methods discussed with respect to FIG. 8, while in an oxygen-free environment, surface oxides may be removed from the metal liner material using a sputter clean process, the metal liner material in the via can be reactivated using a nitrogen plasma, and while still in the oxygen-free environment, a layer of PC material 24 can be deposited. PC material 24 fills the via and covers the exposed surface of ILD 12. A CMP, in an oxygen containing environment, may remove PC material 24 from the top surface of ILD 12. Top electrode 26 can be formed on the top surface of PC material 24 remaining in the via, on exposed portions of the reactivated metal liner (e.g., metal liner 13D), and over portions of ILD 12. In some embodiments, the as-deposited metal liner material in the via is selectively etched and recessed below the top surface of ILD 12 (e.g., the metal liner in the via extends only partially up the vertical sides of the via) before sputter cleaning the metal liner.

FIG. 12A is a top view of semiconductor structure 1200A of a horizontal phase change structure with an oxide-free, reactivated metal liner in a horizontal PCM device in accordance with an embodiment of the present invention. As depicted, FIG. 12A includes a top view of PC material 34 and ILD 12. PC material 34 is essentially the same as PC material 14 in FIG. 1A.

FIG. 12B is a cross-sectional view of semiconductor structure 1200B of the horizontal phase change structure with metal liner 53D in the PCM device in accordance with an embodiment of the present invention. As depicted, FIG. 12B includes bottom electrodes 35 formed on semiconductor substrate 111 using known processes, ILD 12 is on semiconductor substrate 111 between electrodes 35, and metal liner 53D, that is under PC material 34, is over electrodes 35 and on a portion of ILD 12. Semiconductor substrate 111 may be composed of any type of semiconductor substrate, such as silicon, and may include one or more semiconductor devices. As previously discussed with respect to FIG. 1A, electrodes 35 may be on a contact in semiconductor substrate 111. Metal liner 53D can be formed with materials and processes similar or the same as metal liner 13D in FIG. 1A.

As depicted, metal liner 53D abuts and is covered by a horizontal layer of PC material 34. In some embodiments, metal liner 53D covers one of a portion of each of electrodes 35, covers only ILD 12, or covers only a portion of ILD 12. As depicted, the two electrodes 35 can be horizontally aligned with top surfaces at the same level in ILD 12. In some embodiments, a dielectric material, such as ILD 12 (not depicted) surrounds semiconductor structure 1200B.

As known to one skilled in the art, using essentially the same or similar processes to the processes discussed with respect to FIG. 8, metal liner 53D can be formed on ILD 12 abutting electrodes 35. In this case, metal liner 53D with an oxide-free surface and a surface reactivation using the nitrogen plasma can provide a desired electrical resistance (e.g., less than the resistance of an amorphous PC material 44 and greater than the resistance of a crystalline PC material 44).

FIG. 13 is a cross-sectional view of semiconductor structure 1300 of another horizontal phase change bridge structure with metal liner 63D in accordance with an embodiment of the present invention. As depicted, FIG. 13 includes a pair of horizontally aligned electrodes 45 formed with known semiconductor processes on semiconductor substrate 111 surrounded by ILD 12 and covered by PC material 44 with metal liner 63D directly above PC material 44. As previously discussed with respect to bottom electrode 10 in FIG. 1A, electrodes 35 may be on a contact in semiconductor substrate 111. PC material 44 and metal liner 63D are formed with essentially the same materials and similar processes as PC material 14 and metal liner 13D in FIG. 1A, respectively (i.e., metal liner 63D after nitridation has a desired electrical resistance) and as discussed with respect to FIG. 8.

While metal liner 63D is depicted covering PC material 44, in other embodiments, metal liner 63D covers a portion of PC material 44. For example, oxide-free, reactivated metal liner 63D covers only the portion of PC material 44 that is between the two electrodes 45 (e.g., over ILD 12). As known to one skilled in the art, metal liner 63D can be formed over PC material 44 or over a portion of PC material 44 and covered by a layer of a dielectric material, such as ILD 12 (not depicted) using oxygen-free environments and the processes discussed with respect to FIG. 8.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A phase change memory device comprising:
   a heater element on a bottom electrode surrounded by a dielectric material;

a metal nitride liner over the heater element, wherein the metal nitride liner is oxide-free with a top surface that is level with a top surface of the dielectric material;

a phase change material over the metal nitride liner and the dielectric material; and a top electrode over the phase change material.

2. The phase change memory device of claim 1, wherein the metal nitride liner is over a portion of the dielectric material.

3. The phase change memory device of claim 1, wherein the metal nitride liner over the heater element covers the dielectric material.

4. The phase change memory device of claim 1, wherein the desired electrical resistance of the metal nitride liner is less than an electrical resistance of an amorphous state of the phase change material and greater than the electrical resistance of a crystalline state of the phase change material.

5. The phase change memory device of claim 1, wherein the metal nitride liner is a non-planar layer of a metal nitride material.

6. The phase change memory device of claim 1, wherein the metal nitride liner is embedded in a top portion of the dielectric material and is over the heater element in a bottom portion of the dielectric material.

7. A phase change memory device, the phase change device comprising:

a pair of horizontally aligned electrodes in a dielectric material;

a metal nitride liner over the pair of horizontally aligned electrodes and the dielectric material between the pair of horizontally aligned electrodes; and a phase change material over the metal nitride liner.

8. The phase change memory device of claim 7, wherein:

an electrical resistance of the metal nitride liner is less than an electrical resistance of an amorphous state of the phase change material; and the electrical resistance of the metal nitride liner is greater than the electrical resistance of a crystalline state of the phase change material.

9. The phase change memory device of claim 8, wherein the pair of horizontally aligned electrodes have a top surface at a same level as the dielectric material.

10. The phase change memory device of claim 7, wherein the metal nitride liner is without a layer of high resistance surface oxides.

11. A phase change memory device comprising:

a pillar of a phase change material on a bottom electrode;

a layer of a dielectric material contacting a top portion of a sidewall of the pillar of the phase change material;

a metal nitride liner surrounding a bottom portion of the sidewall pillar of the phase change material; and a top electrode contacting the phase change material.

12. The phase change memory device of claim 11, wherein the metal nitride liner surrounding the bottom portion of the sidewall of the pillar of the phase change material contacts the bottom electrode.

13. The phase change memory device of claim 11, wherein the metal nitride liner has an electrical resistance of the metal nitride liner that is less than the electrical resistance of the phase change material in an amorphous state and greater than the electrical resistance of the phase change material in a crystalline state.

14. The phase change memory device of claim 11, wherein the metal nitride liner is without a layer of high resistance surface oxides.

15. The phase change memory device of claim 10, wherein the electric resistance of the metal nitride liner without a layer of high resistance surface oxides and without reactivation is below the electrical resistance of the crystalline phase change material.

16. The phase change memory device of claim 10, further comprises the electric resistance of the metal nitride liner is greater than the electrical resistance of the crystalline phase change material and less than the electrical resistance of the amorphous phase change material when the metal nitride liner is a reactivated metal nitride liner.

\* \* \* \* \*